US009812535B1

United States Patent
Haase et al.

(10) Patent No.: US 9,812,535 B1
(45) Date of Patent: Nov. 7, 2017

(54) METHOD FOR MANUFACTURING A SEMICONDUCTOR DEVICE AND POWER SEMICONDUCTOR DEVICE

(71) Applicant: Infineon Technologies Austria AG, Villach (AT)

(72) Inventors: Robert Haase, San Pedro, CA (US); Martin Vielemeyer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/363,740

(22) Filed: Nov. 29, 2016

(51) Int. Cl.
*H01L 29/40* (2006.01)
*H01L 29/66* (2006.01)
*H01L 29/423* (2006.01)
*H01L 29/10* (2006.01)
*H01L 29/78* (2006.01)

(52) U.S. Cl.
CPC ........ *H01L 29/407* (2013.01); *H01L 29/1095* (2013.01); *H01L 29/401* (2013.01); *H01L 29/408* (2013.01); *H01L 29/4236* (2013.01); *H01L 29/66734* (2013.01); *H01L 29/7813* (2013.01)

(58) Field of Classification Search
CPC ............... H01L 29/407; H01L 29/1095; H01L 29/4236; H01L 29/7813; H01L 29/401; H01L 29/408; H01L 29/66734
See application file for complete search history.

(56) References Cited

U.S. PATENT DOCUMENTS

2012/0199899 A1* 8/2012 Kobayashi ............ H01L 29/407
257/330

* cited by examiner

*Primary Examiner* — Walter H Swanson
(74) *Attorney, Agent, or Firm* — Murphy, Bilak & Homiller, PLLC (57) ABSTRACT

A method for manufacturing a semiconductor device includes: providing a semiconductor substrate having a first side; forming a trench in the semiconductor substrate, the trench having a bottom and a sidewall extending from the bottom to the first side of the semiconductor substrate; forming an insulation structure including at least a first insulation layer and a second insulation layer on the sidewall and the bottom of the trench; forming a lower conductive structure in the lower portion of the trench; removing the second insulation layer in an upper portion of the trench while leaving the second insulation layer at least partially in a lower portion of the trench; and forming an upper conductive structure in the upper portion of the trench, wherein at least one of the lower conductive structure and the upper conductive structure comprises a metal, a metal alloy, a metal silicide, or a combination thereof.

16 Claims, 11 Drawing Sheets

METHOD FOR MANUFACTURING A SEMICONDUCTOR DEVICE AND POWER SEMICONDUCTOR DEVICE

TECHNICAL FIELD

Embodiments described herein relate to methods for manufacturing a semiconductor device and power semiconductor devices.

BACKGROUND

Conducting structures integrated into semiconductor devices needs to be electrically insulated from other parts of the device to ensure reliable functioning of the semiconductor device. Examples of such conducting structures are field electrodes and gate electrodes which are insulated from the semiconductor substrate by insulation layers such as oxide layers. In trench MOSFETs the gate electrodes and source electrodes are usually formed of doped polysilicon. Despite high doping, the resistivity of the electrodes can become very high for small lateral dimensions. The high resistivity may limit the shrink of the trench and cell pitch, and especially for low voltage MOSFETs the $R_{DS(on)}$ reduction As switching of a potential applied to the conducting structures at high frequency may occur, it may be desirable to form the conducting structures or at least some of the conducting structures of a material having a low resistivity. However, use of a material having a low resistivity may reduce a thermal budget for subsequent processing steps. This may be especially disadvantageous for a field electrode made of metal, since the field electrode is usually formed before forming the gate oxide. The gate oxidation usually has a temperature budget, which is not compatible with the metal electrode being formed before.

In view of the above, there is a need for improvement.

SUMMARY

According to an embodiment, a method for manufacturing a semiconductor device is provided. The method includes: providing a semiconductor substrate having a first side; forming a trench in the semiconductor substrate, the trench having a bottom and a sidewall extending from the bottom to the first side of the semiconductor substrate; forming an insulation structure including at least a first insulation layer and a second insulation layer on the sidewall and the bottom of the trench; forming a lower conductive structure in the lower portion of the trench; removing the second insulation layer in an upper portion of the trench while leaving the second insulation layer at least partially in a lower portion of the trench; and forming an upper conductive structure in the upper portion of the trench, wherein at least one of the lower conductive structure and the upper conductive structure comprises a metal, a metal alloy, a metal silicide, or a combination thereof.

According to an embodiment, a power semiconductor device is provided. The power semiconductor device includes: a semiconductor substrate having a first side; a trench formed in the semiconductor substrate, the trench having a bottom and a sidewall extending from the bottom to the first side of the semiconductor substrate; an insulation structure including at least a first insulation layer covering the bottom of the trench and extending from the bottom of the trench along the sidewalls of the trench to the first side of the semiconductor substrate, and a second insulation layer on the first insulation layer and extending along the first insulation layer to an upper end of the second insulation layer being recessed relative to the first side of the semiconductor substrate, wherein the first insulation layer and the second insulation layer are made of different materials, and wherein the upper end of the second insulation layer defines an upper end of a lower portion of the trench; a lower conductive structure in the lower portion of the trench, wherein each of the first and the second insulation layers is arranged between the lower conductive structure and the semiconductor substrate; and an upper conductive structure in an upper portion of the trench above the lower portion, wherein the first insulation layer is arranged between the upper conductive structure and the semiconductor substrate.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings.

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing", "lateral", "vertical" etc., is used with reference to the orientation of the Figure(s) being described. These terms are intended to encompass different orientations of the device in addition to different orientations than those depicted in the figures. Because components of embodiments can be positioned in a number of different orientations, the directional terminology is used for purpose of illustration and is in no way limiting. Further, terms such as "first", "second", and the like, are also used to describe various elements, regions, sections, etc. and are also not intended to be limiting. Like terms refer to like elements throughout the description. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second surface of a semiconductor substrate is considered to be formed by the lower or backside surface while a first surface is considered to be formed by the upper, front or main surface of the semiconductor substrate. This description of the second surface and the first surface can also include buried conductive layers which may be routed to the surface of the substrate. The terms "above" and "below" as used in this specification therefore describe a relative location of a structural feature to another structural feature with consideration of this orientation.

The terms "electrical connection" and "electrically connected" describes an ohmic connection between two elements.

Some embodiments are described next with reference to the Figures. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

The embodiments illustrated in the Figures mainly pertain to power semiconductor devices without being limited thereto. The power semiconductor devices typically includes a first major electrode on an upper or first side of a semiconductor substrate and a second major electrode on lower or second side of the semiconductor substrate. A current path is defined between the first major electrode and the second major electrode, which current path extend across at least one pn-junction formed in the semiconductor substrate between the first side and the second side. The current path can be controllable through a control electrode which is also referred to as gate electrode.

Figure 1A:
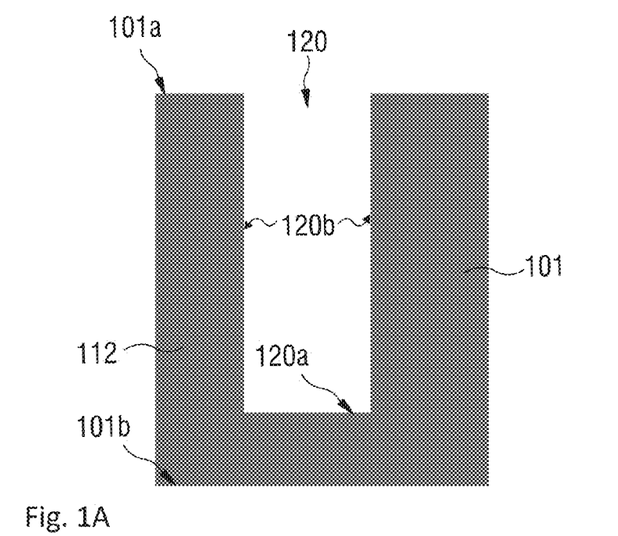
FIGS. 1A and 1B illustrate, in a cross-sectional view of a semiconductor substrate, processes according to an embodiment.

FIG. 1A shows a semiconductor substrate 101. The semiconductor substrate 101 can have first side 101a. Further, the semiconductor substrate 101 can have a second side 101b opposite the first side 101a. According to embodiments; the semiconductor substrate 101 includes a drift region 112 which can be lightly n-doped. In the following, the semiconductor substrate is referred to as substrate.

For instance, the substrate 101 can be made of any semiconductor material suitable for manufacturing semiconductor components. Examples of such materials include; without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC, GaN, materials are used for the substrate 101. Further, the substrate 101 can include an epitaxially grown layer which may form the drift region.

Further doping regions such as p-doped body regions forming pn-junctions with the drift region can be integrated into the substrate 101.

According to some embodiments, at least one trench 120 can be formed in the semiconductor substrate 101. Specifically, the at least one trench 120 can be formed in the drift region of the substrate 101. According to embodiments, a plurality of trenches 120 can be formed in the substrate 101.

Without being limited thereto, the at least one trench can be formed, e.g. by forming a hard mask (not shown) or photoresist (not shown) on the substrate 101, specifically on the first side 101a of the substrate 101. For instance, the hard mask can be formed by depositing an inorganic material such as an oxide. An example is depositing TEOS (Tetraethyl Orthosilicate). A photoresist can be deposited on the deposited inorganic material. A portion of the photoresist corresponding to the location of the at least one trench 120 to be formed can be removed by photolithographic techniques, exposing a portion of the deposited material that corresponds to the location of the at least one trench 120. Accordingly, the portion of the deposited material corresponding to the at least one trench 120 can be removed, e.g., by etching, to form the hard mask. Thereafter, the photoresist can be removed. The at least one trench 120 can be formed by etching the semiconductor substrate 101 using the hard mask as an etching mask According to some embodiments, the at least one trench 120 can have a bottom 120a and a sidewall 120b extending from the bottom 120a to the first side 101a of the semiconductor substrate 101. The at least one trench 120 can have a depth of equal to or more than 0.1 µm, specifically equal to or more than 0.5 µm, typically equal to or more than 1 µm, and/or equal to or less than 15 µm, specifically equal to or less than 3 µm, typically equal to or less than 1 µm. Specifically, the depth of the at least one trench 120 can depend on a voltage rating of the semiconductor device. For low voltage semiconductor devices, the depth of the at least one trench 120 can be in the range from 0.1 µm to 3 µm. For power semiconductor devices, the depth of the at least one trench 120 can be in the range from 1 µm to 15 µm.

Further, the at least one trench 120 can have a smallest lateral dimension of equal to or more than 100 nm, specifically equal to or more than 200 nm, typically equal to or more than 300 nm, and/or equal to or less than 900 nm, specifically equal to or less than 700 nm, typically equal to or less than 500 nm. According to some embodiments, the at least one trench 120 can be formed to have an aspect ratio of the depth to smallest lateral extension of at least 2:1, particularly of at least 4:1. The geometrical dimensions of the at least one trench 120, particularly the depth, are typically governed by the rated blocking voltage of the final device.

Figure 1B:
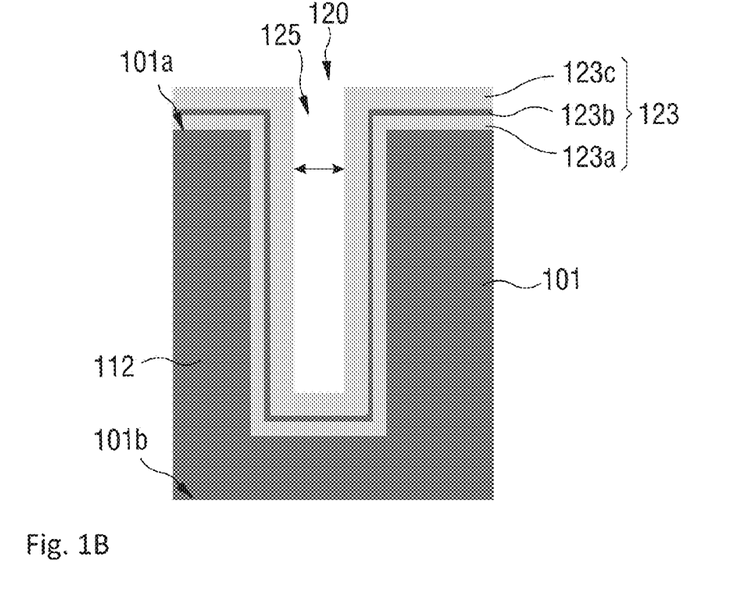

As shown in FIG. 1B, an insulating structure 123 can be formed. The insulating structure 123 can be formed on the first side 101a of the substrate 101. Specifically, the insulating structure 123 can be formed on the sidewall 120b and the bottom 120a of the at least one trench 120. The insulating structure 123 can include at least a first insulation layer 123a and a second insulation layer 123b on the sidewall 120b and the bottom 120a of the at least one trench 120. The second insulation layer 123b and the first insulation layer 123a can be made of different materials.

The first insulation layer 123a can cover the bottom of the trench 120 and can extend from the bottom of the trench 120 along the sidewalls of the trench 120 to the first side 101a of the semiconductor substrate 101. The first insulation layer 123a can be formed by a first insulation material For instance, the first insulation layer 123a can be formed by oxidising the sidewall 120b and the bottom of the at least one trench 120.

The first insulation layer 123a can formed by a first insulating material, which can be, e.g., deposited on the semiconductor substrate 101 and/or in the trench 120, specifically so as to cover the bottom of the trench 120 and can extend from the bottom of the trench 120 along the sidewalls of the trench 120 to the first side 101a of the semiconductor substrate 101. For instance, the first insulation material ca be deposited by CVD (chemical vapour deposition), HTO CVD (high temperature oxide CVD), HDP CVD (high-density plasma chemical vapour deposition), TEOS (Tetraethyl Orthosilicate) deposition, or PSG (phosphosilicate glass) deposition, or BPSG (borophosphosilicate glass) deposition. The first insulating material can be an oxide, such as silicon oxide, silicon dioxide, hafnium oxide and zirconium oxide. Further, the first insulating material can be a combination of an oxidized and deposited oxide, such as silicon dioxide. According to embodiments, the first insulting layer 123a can function as a gate oxide and/or part of a gate oxide.

The second insulation layer 123b can be formed on and cover the first insulation layer 123a at least in the at least one trench 120. Specifically, the second insulation layer 123b can extend along the first insulation layer 123a to an upper end of the second insulation layer 123b. The second insulation layer 123b can formed by a second insulating material, which can be, e.g., deposited on the first insulation layer 123a. The second insulation material can be different to the first insulation material and/or selectively etchable with respect to the first insulation material. Specifically, the second insulation material can be an oxygen-resistant material, specifically a material that is impervious to oxygen diffusion. For instance, the second insulation material can be a silicon nitride and the second insulation layer 123b can be a silicon nitride layer.

According to some embodiments, the insulation structure 123 can further include a third insulation layer 123c on the second insulation layer 123b. The third insulation layer 123c can be formed on and cover the second insulation layer 123b at least in the at least one trench 120. Specifically, the third insulation layer 123c can extend along the second insulation layer 123b to an upper end of the third insulation layer 123c. The third insulation layer 123c can formed by a third insulating material, which can be, e.g., deposited on the second insulation layer 123b. The third insulating material can be different from the second insulating material. For instance, the third insulation material ca be deposited by CVD (chemical vapour deposition), HTO CVD (high temperature oxide CVD), HDP CVD (high-density plasma chemical vapour deposition), TEAS (Tetraethyl Orthosilicate) deposition, or PSG (phosphosilicate glass) deposition, or BPSG (borophosphosilicate glass) deposition. The third insulating material can be an oxide, such as silicon oxide.

According to some embodiments, the insulation structure 123 can be formed such to keep a space 125 within the at least one trench 120. Specifically, the insulation structure 123 can define and bound the space 125 within the at least one trench 120.

Figure 2A:
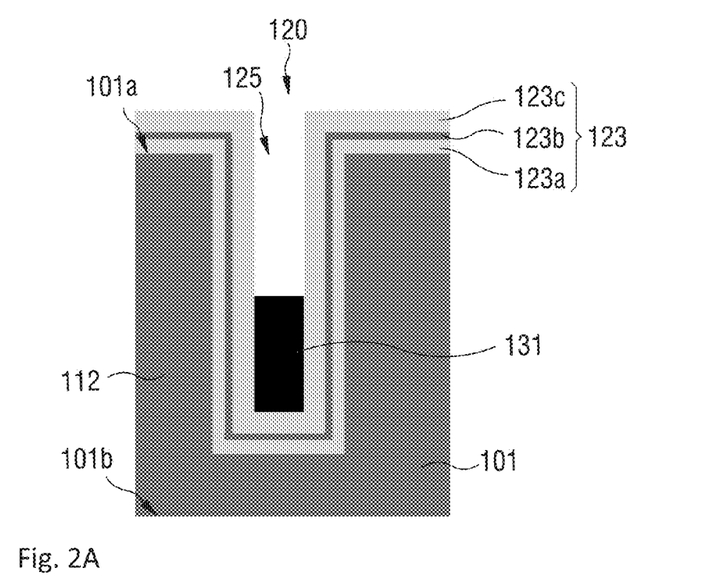
FIGS. 2A to 2F illustrate, in a cross-sectional view of a semiconductor substrate, further processes according to an embodiment.

As shown in FIG. 2A, a lower conductive structure 131 can be formed in a lower portion of the at least trench 120. Specifically, a lower portion of the space 125 of the at least one trench 120 can be filed at least partially with a first conducting material for forming the lower conductive structure 131 in the lower portion of the at least one trench 120. For instance, the first conducting material can be a material having a low resistivity such as a metal. Particularly, the first conducting material can be a metal or a metal composition such as TiN and W. Alternatively, the first conductive material can be a doped, e.g. phosphorus doped, or undoped polycrystalline semiconductor material, such as poly-Si, doped amorphous silicon, tungsten silicide, refractory metal silicide, titanium nitride, refractory metal, and/or combinations thereof.

Further, the lower conductive structure can be formed such that each of the first and the second insulation layer 123a, 123b is arranged between the lower conductive structure 131 and the semiconductor substrate 101. According to embodiments, the third insulation layer 123c can be arranged between the lower conductive structure 131 and the semiconductor substrate 101. For instance, the first conducting material can be deposited by a process such as XX. After deposition of the first conductive material, excessive first conductive material can be removed from the first side 101a of the substrate, e.g. by a chemical-mechanical planarization (CMP) process, and the at least one trench 120, e.g. by etching. In the case of a composition of TiN and W being the first conductive material, a W etchback, which can be selective to TiN, can be performed to recess W. Further, a $NH_4OH+H_2O_2$ ratio TBD can be performed to remove the exposed TIN.

Figure 2B:
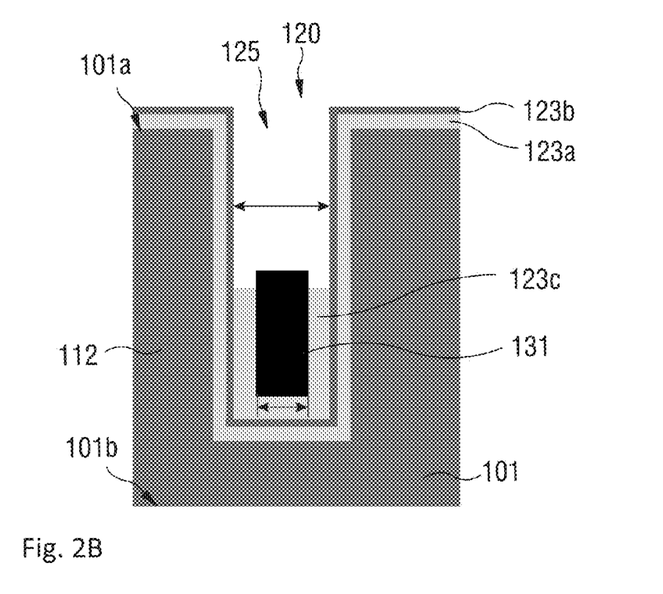

As shown in FIG. 2B, the third insulation layer 123c can be removed in the upper portion of the trench 120 while the third insulation layer 123c can be left at least partially in the lower portion of the trench 120. Specifically, the third insulation layer 123c can be removed to such an extent that an upper end of the partially removed third insulation layer 123c can be below an upper end of the lower conductive structure 131. For instance, the third insulation layer 123c can be removed by wet etching, specifically by a wet etching process having an isotropic etch rate, such as a HF vapour or Dilute HF solution. According to embodiments, the third insulation material can be etched selectively to the second insulation material to partially remove the third insulation layer 123c from the first insulation layer 123a and the second insulation layer 123b.

Figure 2C:
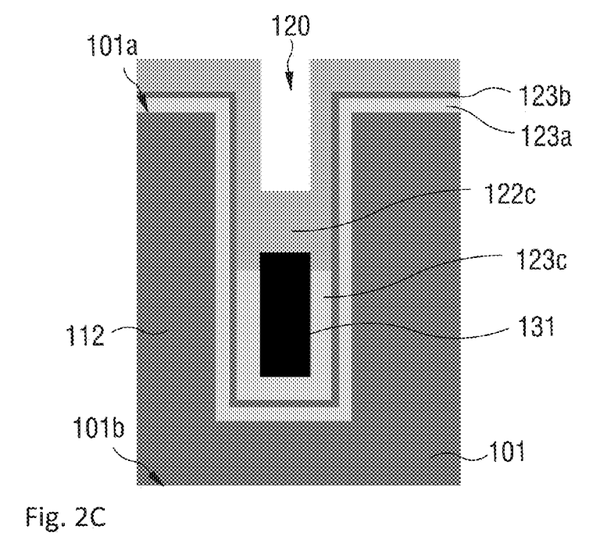

As shown in FIG. 2C, an insulation plug 126 can be formed in the at least one trench 120, specifically on the lower conductive structure 131 after the third insulation layer 123c has been removed in the upper portion of the at least one trench 120. For instance, the insulation plug 126 can be formed by deposition of a dielectric material 122c, such as an oxide, on and/or in the at least on trench 120, specifically on the lower conductive structure 131. According to some embodiments, the dielectric material 122c is wholly deposited. Alternatively, in case of the first conducting material being a polycrystalline semiconductor material, the first conducting material can be oxidised.

Figure 2D:
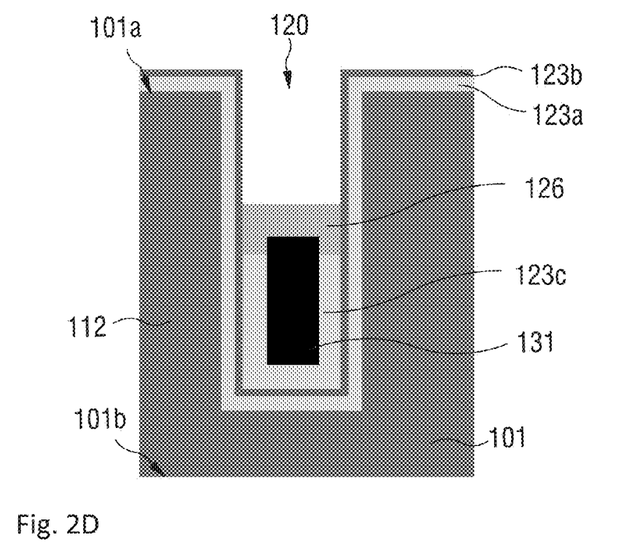

A shown in FIG. 2D, after deposition of the dielectric material 122c, excessive dielectric material 122c can be removed from the first side 101a of the substrate 101 and the at least one trench 120, e.g. by a chemical-mechanical planarization (CMP) process and/or etching.

Figure 2E:
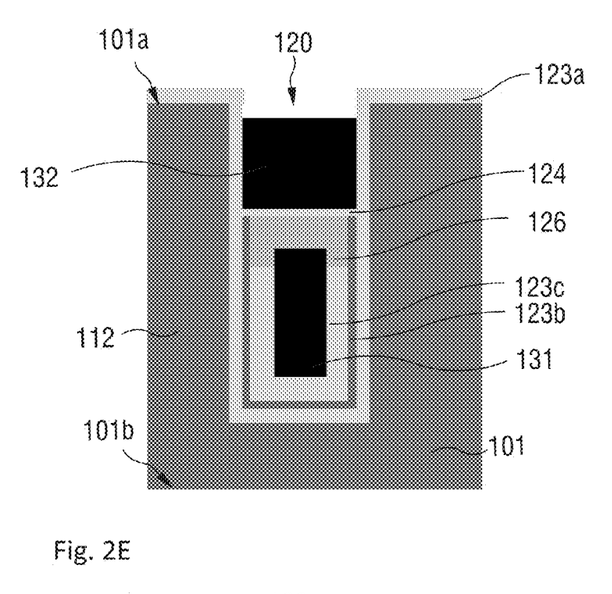

As shown in FIG. 2E, the second insulation layer 123b can be removed in an upper portion of the trench 120 while the second insulation layer 123b is left at least partially in a lower portion of the trench 120. Further, the upper end of the second insulation layer 123b can define an upper end of a lower portion of the trench 120. Specifically, the upper end of the second insulation layer 123b can be flush with an upper end of the insulation plug 126. As shown in FIG. 2E, the third insulation layer 123c can be removed such that an upper end of the third insulation layer 123c is below an upper end of the second insulation layer 123b after the second insulation layer 123b has been removed in the upper portion of the trench 120. According to embodiments, the upper end of the third insulation layer 123c is recessed relative to the upper end of the second insulation layer 123b.

According to some embodiments, a dielectric layer 124 can be deposited in the at least one trench 120, specifically on the insulation plug 126. The dielectric layer 124 can be a high-quality the dielectric layer which can later function as a gate oxide. When practicing some embodiments, a performance of the gate oxide can be improved by the dielectric layer 124.

According to some embodiments, an upper conductive structure 132 can be formed in the upper portion of the trench 120. Specifically, the upper conductive structure 132 can be formed on the insulation plug 126. For instance, the upper portion of the space 125 of the at least one trench 120 can be filled at least partially with a second conductive material for forming the upper conductive structure 132 in the upper portion of the at least one trench 120. The second conductive material can be a doped, e.g. phosphorus doped, or undoped polycrystalline semiconductor material, such as poly-Si, doped amorphous silicon, tungsten silicide, refractory metal silicide, titanium nitride, refractory metal, and/or combinations thereof. Alternatively, the second conductive material can be a material having a low resistivity such as a metal. Particularly, the second conducting material can be a metal or a metal composition such as TiN and W.

Similar to the first conductive material, after deposition of the second conductive material, excessive second conductive material can be removed from the first side 101a of the substrate 101 and the at least one trench 120, e.g. by a chemical-mechanical planarization (CMP) process and/or etching. Further, the upper portion of the at least one trench 120, in which the upper conductive structure 132 is formed, can be above the lower portion of the at least one trench 120. Further, the first insulation layer 123a can be arranged between the upper conductive structure 132 and the semiconductor substrate 101.

According to embodiments, removing the second insulation layer 123b in the upper portion of the trench 120 includes wid9ening the space in the upper portion of the trench 120. That is, the at least one trench 120 can be widened by the removal of the second insulating layer 123b and/or the third insulation layer 123c. Accordingly, the upper conductive structure 132 can have a lateral width which is larger than a lateral width of the lower conductive structure 131.

Accordingly, the insulation plug 126 can be formed prior to removing the second insulation layer 123b in the upper portion of the at least one trench 120. Further, the lower conductive structure 131 can be formed before the second insulation layer 123b is removed in the upper portion of the trench 120. Furthermore, the upper conductive structure 132 can be formed in the upper portion of the at least one trench 120 after the second insulation layer 123b is removed in the upper portion of the trench 120.

As shown in FIG. 2E, the insulation plug 126 can be arranged between the lower conductive structure 131 and the upper conductive structure 132 to electrically insulate the lower conductive structure 131 from the upper conductive structure 132. The lower conductive structure 131 can form a field electrode and/or the upper conductive structure 132 can form a gate electrode.

Figure 2F:
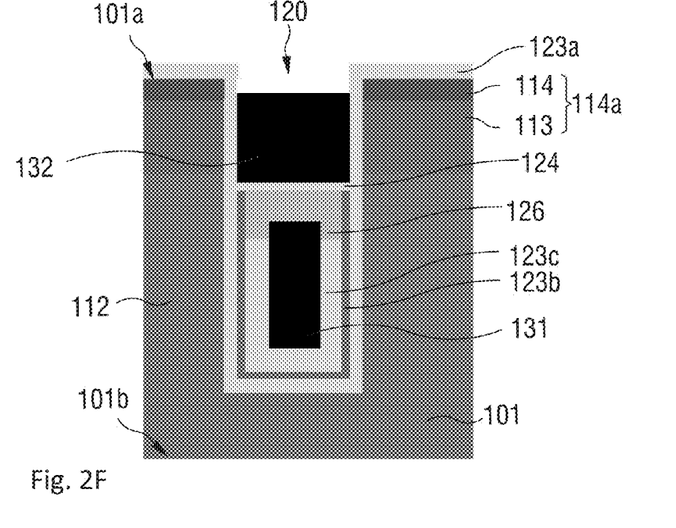

As shown in FIG. 2F, the semiconductor substrate 101 can include further to the drift region 112 a doping region 114a. The doping region 114a can include a source region 114 and a body region 113 between the drift region 112 and the source region 114. According to embodiments, an electrical connection between the doping region 114a and the lower conductive structure 131 in the at least one trench 120 can be formed. Accordingly, when a certain potential, such as a source potential, is applied to the doping region 148, specifically to the source region 114, this potential can be applied to the lower conductive structure 131 as well. When practicing embodiments, the lower conductive structure 131 can be at the same potential has the doping region 114a, specifically at the same potential as the source region 114.

A dopant can be implanted into the drift region 112 to form a body region 113 having a conductivity type opposite to the conductivity type of the drift region 112. For instance, when the substrate 101 is an n-type semiconductor, the body region 113 can be doped with a p-type dopant, and vice versa. Doping of the body region 113 can lead to a change of a semiconductor conductivity type, e.g. from n-type to p-type, and vice versa. According to embodiments, the dopant, specifically for the implantation of the body region 113, can be Boron (B), which can be implanted at 60 keV to a concentration of 1.6 E13/$cm^2$. Thereafter, a thermal treatment can be performed. For instance, the semiconductor device 100 can be subjected to a thermal treatment of about 1000° C. for about 60 min (Body Drive).

Further, the source region 114 can be formed in at least some regions in which the body regions 113 were formed. For forming the source region 114, a further patterning process by lithographic methods including a photoresist and pattering the photoresist can be performed. According to embodiments, the dopant for the implantation of the source regions 114 can be Arsenic (As), which can be implanted at 30 keV to a concentration of 3 E15/$cm^2$. According to embodiments, the absolute dopant concentration of the source region 114 can be higher than the dopant concentration in the body region 113. Thereafter, the photoresist can be removed and/or a thermal treatment can be performed.

Accordingly, a power semiconductor device can be provided that includes a field electrode beneath a gate electrode. According to embodiments, the field electrode can be a metal electrode. With common manufacturing processes it is not possible to provide a field electrode made of the metal as subsequent processing steps, such as the formation of a gate electrode, require a temperature that would deteriorate or even melt the metal of the metal field electrode. Inter alia by the deposition of the first insulating layer 123a, which can later function as a gate electrode, processing steps that require a high temperature budget can be performed before the metal field electrode is deposited. Therefore, a power semiconductor device having a fast switching field electrode can be provided.

Particularly, the present disclosure provides a method for manufacturing a semiconductor device in which the gate oxidation process can be moved to before forming of the field electrode. Accordingly, high temperature processes after the forming of the field electrode can be avoided. Thereby, use of a metal field electrode can be enabled.

According to some embodiments, at least one of the following relationships can be satisfied: the first conductive material and the second conductive material are the same conductive material; the first conductive material and the second conductive material include a metal, a metal alloy, a metal silicides, doped polysilicon, or a combination thereof; the first conductive material and the second conductive material are of different conductive materials; the first conductive material include a metal, a metal alloy, a metal silicides, or combination thereof, and the second conductive material include doped polysilicon; and the first conductive material include doped polysilicon, and the second conductive material include a metal, a metal alloy, a metal silicides, or combination thereof. Among these, the combination of the first conductive material including a metal, a metal alloy, a metal silicides, or combination thereof, and the second conductive material including doped polysilicon can be particularly beneficial.

FIGS. 3A to 3D show further embodiments of the present disclosure. The situation shown in FIG. 3A can be compared to the situation shown in FIG. 2B, expect of a lower conductive structure 331 being formed instead of the lower conductive structure 131 shown in FIG. 2A. That is, some or all processes described with reference to FIGS. 1 to 2B or additional processes not described with reference to FIGS. 1 to 2B can be performed to come to the situation shown in FIG. 3A. The lower conductive structure 331 can be formed by the processes and materials described for the lower conductive structure 131.

Figure 3A:
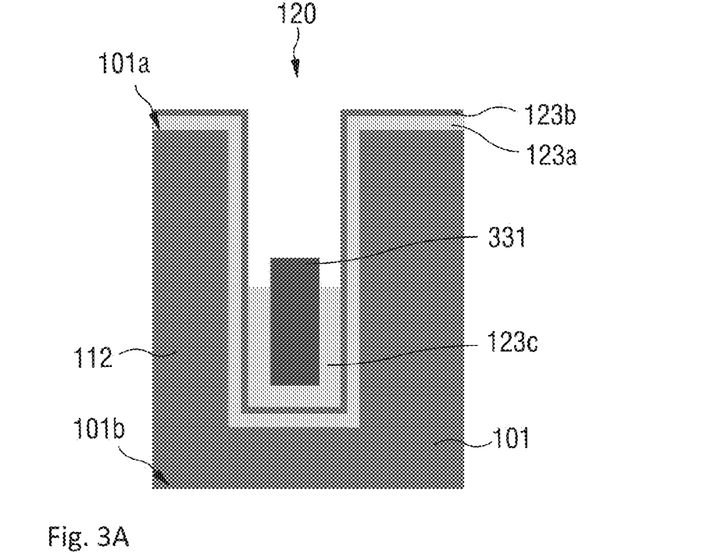
FIGS. 3A to 3D illustrate, in a cross-sectional view of a semiconductor substrate, further processes according to an embodiment.

FIG. 3A shows that the third insulation layer 123c can be removed in the upper portion of the trench 120 while the third insulation layer 123c can be left at least partially in the lower portion of the trench 120. Specifically, the third insulation layer 123c can be removed to such an extent that an upper end of the partially removed third insulation layer 123c can be below an upper end of the lower conductive structure 131. For instance, the third insulation layer 123c can be removed by wet etching, specifically by a wet etching process having an isotropic etch rate, such as a HF vapour or Dilute HF solution. According to embodiments, the third insulation material can be etched selectively to the second insulation material to partially remove the third insulation layer 123c from the first insulation layer 123a and the second insulation layer 123b.

Figure 3B:
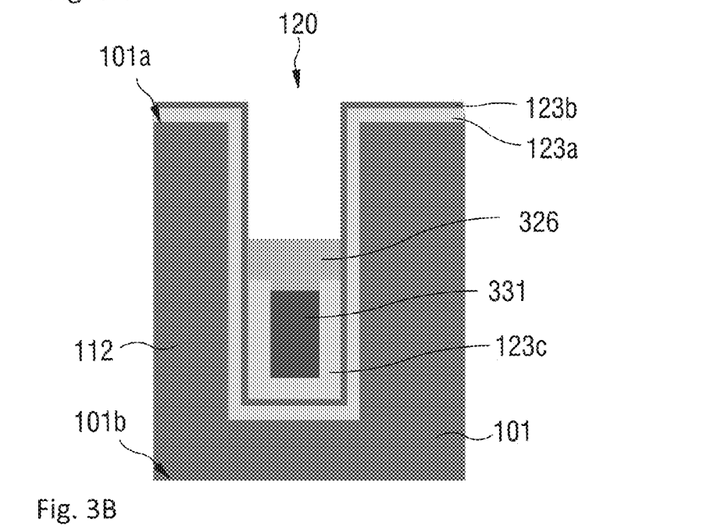

As shown in FIG. 3B, an insulation plug 326 can be formed in the at least one trench 120, specifically on the lower conductive structure 331 after the third insulation layer 123c has been removed in the upper portion of the at least one trench 120. As described herein, the insulation plug 126 can be formed by deposition of a dielectric material 122c and removal of excessive dielectric material 122c. For instance, the insulation plug 326 can be formed by deposition of a dielectric material, such as an oxide, on the at least on trench 120, specifically on the lower conductive structure 331. According to some embodiments, the dielectric material can be wholly deposited. Alternatively, in case of the first conducting material being a polycrystalline semiconductor material, the first conducting material can be oxidised. After deposition of the dielectric material, excessive dielectric material can be removed from the first side 101a of the substrate 101 and the at least one trench 120, e.g. by a chemical-mechanical planarization (CMP) process and/or etching.

Figure 3C:
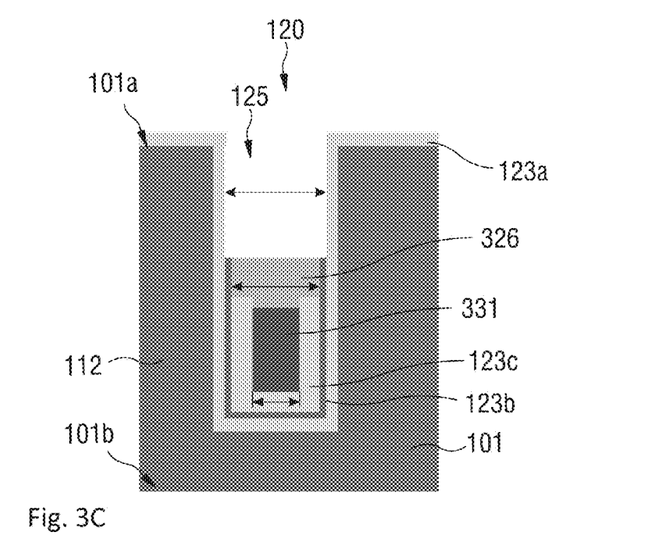

As shown in FIG. 3C, the second insulation layer 123b can be removed in an upper portion of the trench 120 while the second insulation layer 123b is left at least partially in a lower portion of the trench 120. Further, the upper end of the second insulation layer 123b can define an upper end of a lower portion of the trench 120. Specifically, the upper end of the second insulation layer 123b can be flush with an upper end of the insulation plug 126. As shown in FIG. 2E, the third insulation layer 123c can be removed such that an upper end of the third insulation layer 123c is below an upper end of the second insulation layer 123b after the second insulation layer 123b has been removed in the upper portion of the trench 120.

FIG. 3C shows that the lower conductive structure 331 and the insulation plug 326 can be for so as to have different widths. Specifically, the lower conductive structure 331 can be formed to have a first width w1. The insulation plug 326 can be formed to have a second width w2. The second width w2 can be larger than the first width w1. Specifically, the second width w2 can be greater than the first width w1 by an amount of a lateral extension of the third insulating layer 123c along a direction of the first width w1.

Further, removing the second insulation layer 123b in the upper portion of the trench 120 includes widening the space in the upper portion of the trench 120. That is, the at least one trench 120 can be widened by the removal of the second insulating layer 123b and/or the third insulation layer 123c. Accordingly, the first insulating layer 123a formed on opposite portions of the at least one trench 120 can be separated by a third width w3, which can be larger than the first width w1 and the second width w2. Specifically, the third width w3 can be greater than the first second width w2 by an amount of a lateral extension of the second insulating layer 123b along a direction of the first width w1.

Figure 3D:
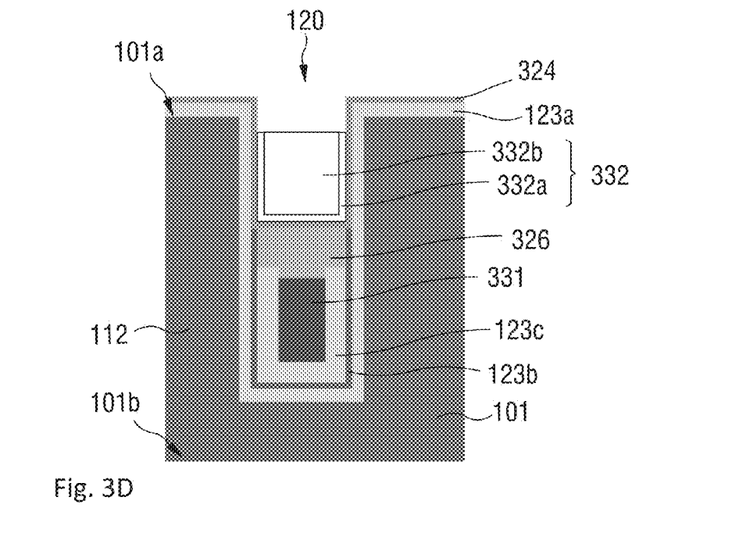

As shown in FIG. 3D, a dielectric layer 324 can be deposited in the at least one trench 120, specifically on the insulation plug 326. The dielectric layer 324 can also be deposited on the first side 101a of the substrate 101. While the dielectric layer 124 can be removed from the first side 101a of the substrate 101 and/or the sidewalls 120b of the at least one trench 120, the dielectric layer 324 can be left on the first side 101a of the substrate 101 and/or the sidewalls 120b of the at least one trench 120. The dielectric layer 324 can be a high-quality the dielectric layer which can later function as a gate oxide. When practicing some embodiments, a performance of the gate oxide can be improved by the dielectric layer 324.

Further, an upper conductive structure 332 can be formed can be formed in the upper portion of the trench 120. The upper conductive structure 332 can be formed by the processes and materials described for the upper conductive structure 132, while the upper conductive structure 332 can be formed by more than one sub-structures.

For instance, the upper conductive structure 332 can include a first conductive sub-structure 332a and a second conductive sub-structure 332b. The first conductive sub-structure 332a can be formed so as to cover the insulation plug 326 and/or the sidewalls 120b of the at least one trench 120. When the dielectric layer 324 is present, the first conductive sub-structure 332a can be formed so as to cover the dielectric layer 324 on the insulation plug 326 and/or the sidewalls 120b of the at least one trench 120. The first conductive sub-structure 332a can have an upper end, which can be arranged to be lower than the first side 101a of the substrate 101.

The second conductive sub-structure 332b can be formed so as to have an upper end that is flush with the upper end of the first conductive sub-structure 332a. The first conductive sub-structure 332a and the second conductive sub-structure 332b can be formed by different material as and/or different processes. For instance, the first conductive sub-structure 332a can be formed by a material having a higher conductivity than the second conductive sub-structure 332b. When practicing embodiments, the performance of the upper conductive structure 332 functioning as a gate electrode can be increased.

After the situation shown in FIG. 3D, the processes described with reference to FIG. 2F can be performed. Specifically, the body region 113 and the source region 114 can be formed by implantation of dopants.

Figure 4A:
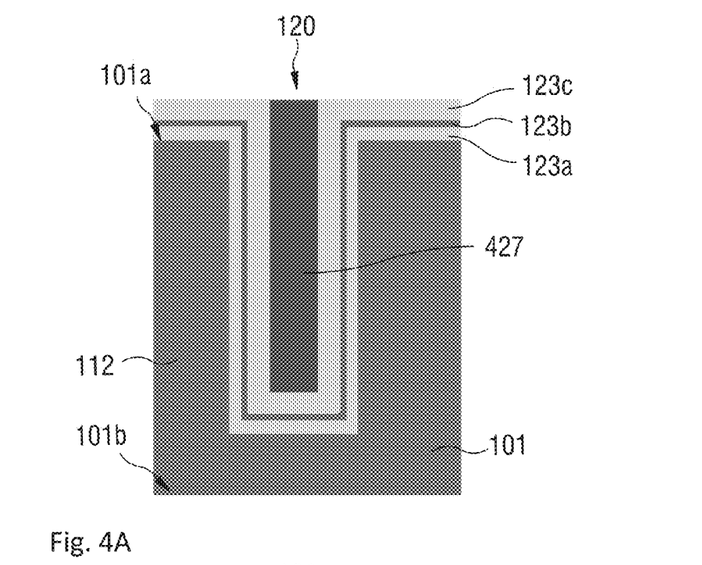
FIGS. 4A to 4G illustrate, in a cross-sectional view of a semiconductor substrate, further processes according to an embodiment.

FIGS. 4A to 4G show further embodiments of the present disclosure. The situation shown in FIG. 4A can be preceded by the processes describes with reference to FIGS. 1A and 1B. As shown in FIG. 4A, a sacrificial structure 427 can be formed in the at least one trench 120. Specifically, the sacrificial structure 427 can be formed by depositing sacrificial material in the at least one trench 120 and/or the first side 101a of the substrate 101. For instance, the sacrificial material can be and/or include carbon and/or a resist material. After deposition of the sacrificial material, excessive sacrificial material can be removed from the first side 101a of the substrate, e.g. by a chemical-mechanical planarization (CMP) process or etching.

Figure 4B:
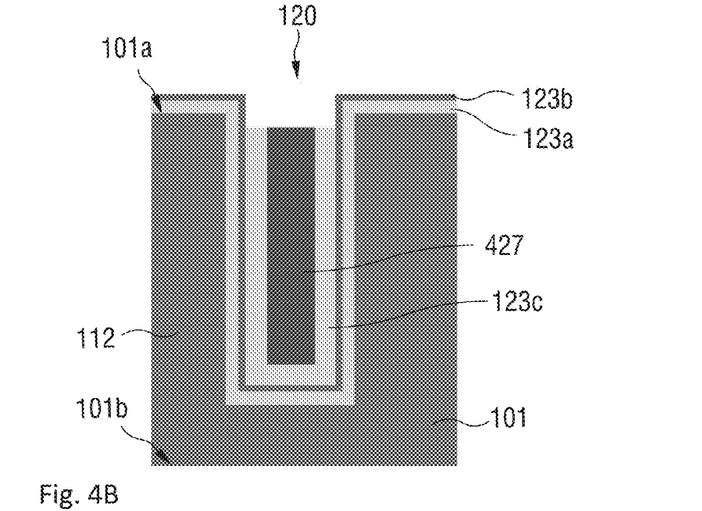

As shown in FIG. 4B, the sacrificial structure 427 can be removed at least partially. Specifically, the sacrificial structure 427 can be removed at least partially such that an upper end of the sacrificial structure 427 is flush with the first side 101a of the substrate 101. For instance, the sacrificial structure 427 can be removed by etching, specifically wet-etching.

Further, the third insulating layer 123c can be removed at least partially. Specifically, the third insulating layer 123c can be removed at least partially such that an upper end of the third insulating layer 123c is flush with the first side 101a of the substrate 101 and/or the upper end of the sacrificial structure 427. For instance, the third insulating layer 123c can be removed by etching, specifically wet-etching.

Figure 4C:
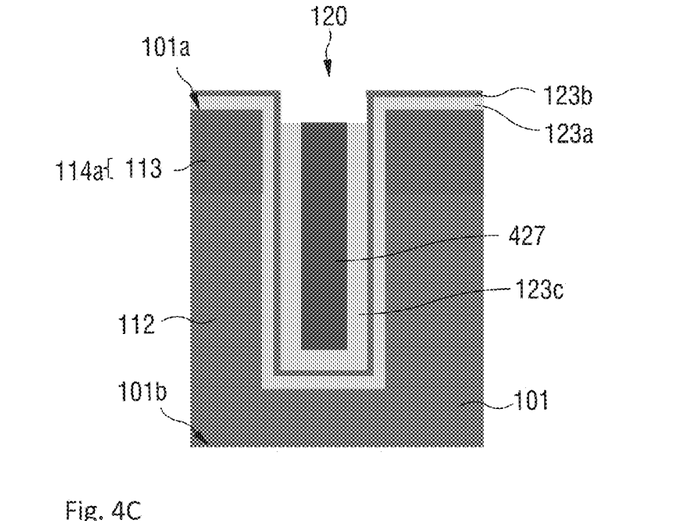

As shown in FIG. 4O, a doping region 114a can be formed in the substrate 101. The doping region 114a can include a body region 113. Specifically, a dopant can be implanted into the drift region 112 to form a body region 113 having a conductivity type opposite to the conductivity type of the drift region 112. For instance, when the substrate 101 is an n-type semiconductor, the body region 113 can be doped with a p-type dopant, and vice versa. Doping of the body region 113 can lead to a change of a semiconductor conductivity type, e.g. from n-type to p-type, and vice versa. According to embodiments, the dopant, specifically for the implantation of the body region 113, can be Boron (B), which can be implanted at 60 keV to a concentration of 1.6 E13/cm$^2$. Thereafter, a thermal treatment can be performed. For instance, the semiconductor device 100 can be subjected to a thermal treatment of about 1000° C. for about 60 min (Body Drive).

Figure 4D:
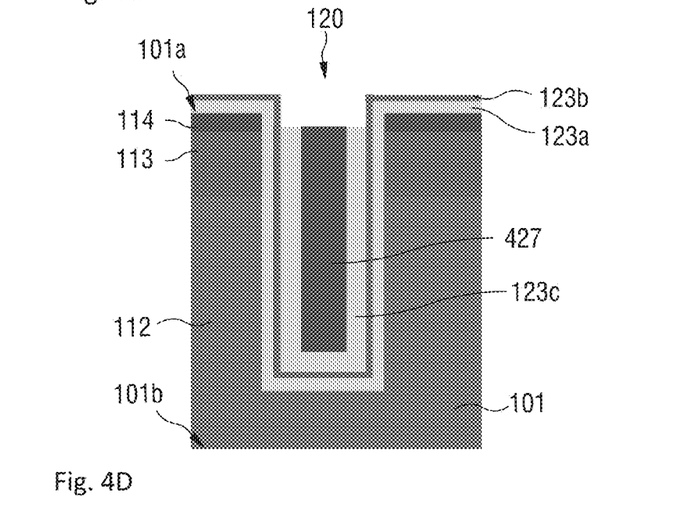

As shown in FIG. 4D, a source region 114 can be formed in at least some regions in which the body regions 113 were formed. For forming the source region 114, a further patterning process by lithographic methods including a photoresist and pattering the photoresist can be performed. According to embodiments, the dopant for the implantation of the source regions 114 can be Arsenic (As), which can be implanted at 30 keV to a concentration of 3 E15/cm$^2$. According to embodiments, the absolute dopant concentration of the source region 114 can be higher than the dopant concentration in the body region 113. Thereafter, the photoresist can be removed and/or a thermal treatment can be performed.

Figure 4E:
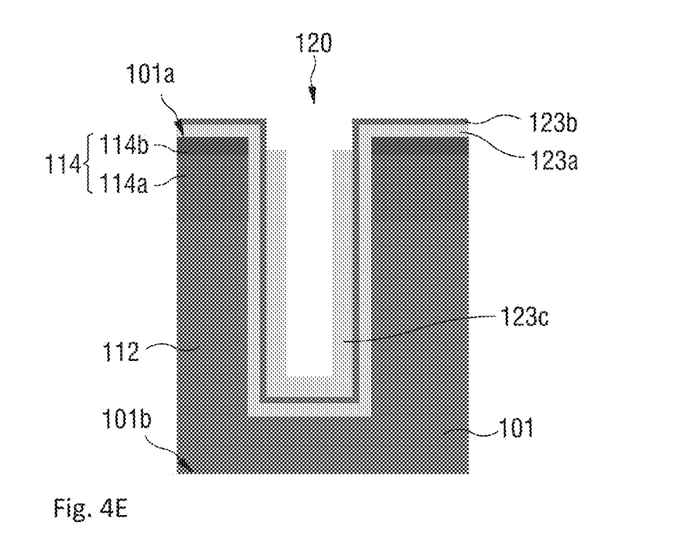

Thereafter, as shown in FIG. 4E, the sacrificial structure 427 can be removed. The sacrificial structure 427 can be removed, e.g. by etching such as wet etching.

Figure 4F:
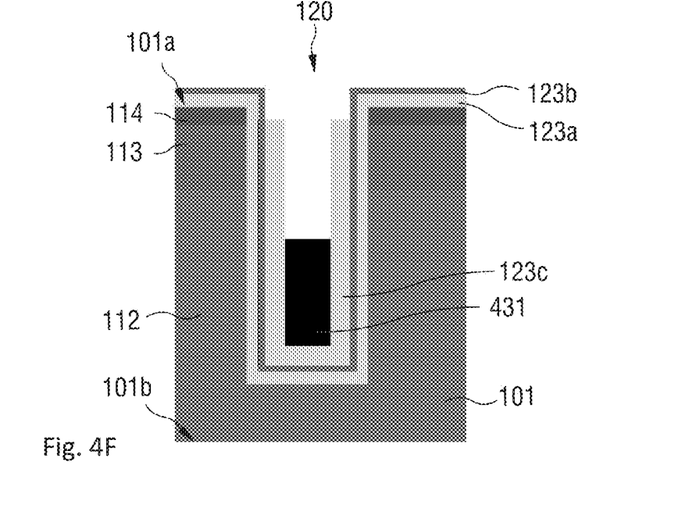

As shown in FIG. 4F, a lower conductive structure 431 can be deposited in a lower portion of the at least one trench 120. The lower conductive structure 431 be formed by the processes and materials described for the lower conductive structure 131 and/or the lower conductive structure 331.

Figure 4G:
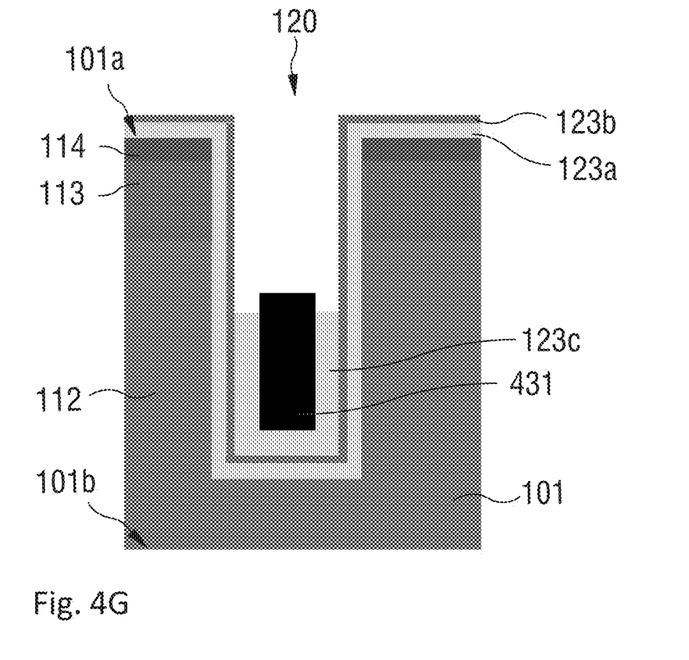

As shown in FIG. 4G, the third insulating layer 123c can be further removed in the upper portion of the trench 120 while the third insulation layer 123c can be left at least partially in the lower portion of the trench 120. The removal of the third insulating layer 123c in the upper portion of the trench 120 can be performed as described with reference to FIG. 2B.

Thereafter, some or all processes described with reference to FIG. 2C to 2D or additional processes not described with reference to FIG. 2C to 2D can be performed and/or some or all processes described with reference to FIG. 3B to 3D or additional processes not described with reference to FIG. 3B to 3D can be performed.

Figure 5:
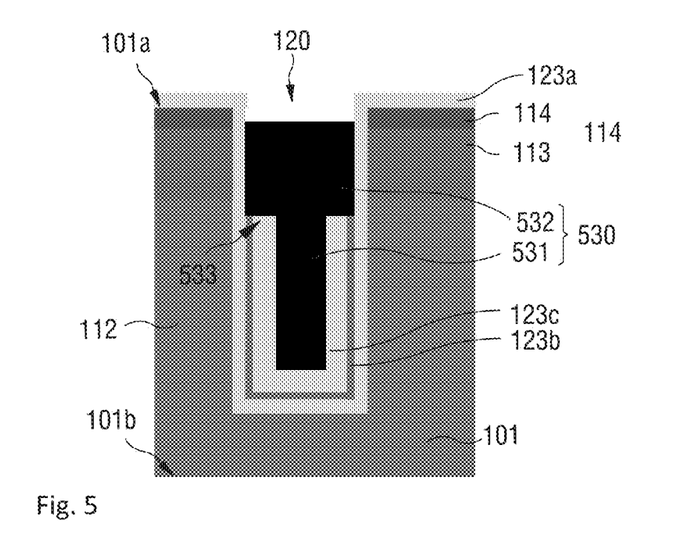
FIG. 5 illustrates, in a cross-sectional view of a semiconductor substrate, further processes according to an embodiment.

FIG. 5 shows further embodiments according to the present disclosure. As shown in FIG. 5, a lower conductive structure 531 and an upper conductive structure 532 can be connected and form a common conductive structure 530. The lower conductive structure 531 can be formed by the same or similar processes and materials described for the lower conductive structure 131, the lower conductive structure 331 and/or the lower conductive structure 431. The upper conductive structure 532 can be formed by the same or similar processes and materials described for the upper conductive structure 132 and/or the lower conductive structure 331. However, the lower conductive structure 531 and the upper conductive structure 532 can be formed in a common process to form a common conductive structure 530 extending from the lower portion to the upper portion of the at least one trench 120. Specifically, the common conductive structure 530 can include a step 533 at a transition between the lower portion and the upper portion of the at least one trench 120.

For instance, the common conductive structure 530, i.e. the lower conductive structure 531 and the upper conductive structure 532, can be formed after the second insulation layer 123b is removed in an upper portion of the trench 120. Alternatively, the lower conductive structure 531 and the upper conductive structure 532 can be formed in separate processes that lead to a, e.g. mechanical and/or electrical, connection of the lower conductive structure 531 and the upper conductive structure 532. In this context, the common conductive 530 structure can be understood as being constituted by the lower conductive structure 531 and the upper conductive structure 532 being electrically and/or mechanically connected to each other.

According to embodiments, a power semiconductor device includes: a semiconductor substrate 101 having a first side 101a; at least one trench 120 formed in the semiconductor substrate 101, the at least one trench 120 having a bottom 120a and a sidewall 120b extending from the bottom 120a to the first side 101a of the semiconductor substrate 101; an insulation structure 123 including at least a first insulation layer 123a covering the bottom of the trench 120 and extending from the bottom of the trench 120 along the sidewalls of the trench 120 to the first side 101a of the semiconductor substrate 101, and a second insulation layer 123b on the first insulation layer 123a and extending along the first insulation layer 123a to an upper end of the second insulation layer 123b being recessed relative to the first side 101a of the semiconductor substrate 101, wherein the first insulation layer 123a and the second insulation layer 123b are comprised of different materials, and wherein the upper end of the second insulation layer 123b defines an upper end of a lower portion of the trench 120; and a common conductive structure 530 including a lower conductive structure 531 in the lower portion of the trench 120, wherein each of the first and the second insulation layer 123a, 123b is arranged between the lower conductive structure 531 and the semiconductor substrate 101, and an upper conductive structure 532 in an upper portion of the trench 120 above the lower portion, wherein the first insulation layer 123a is arranged between the upper conductive structure 532 and the semiconductor substrate 101, specifically wherein the lower conductive structure 531 and the upper conductive structure 532 are electrically and/or mechanically connected to each other.

Figure 6:
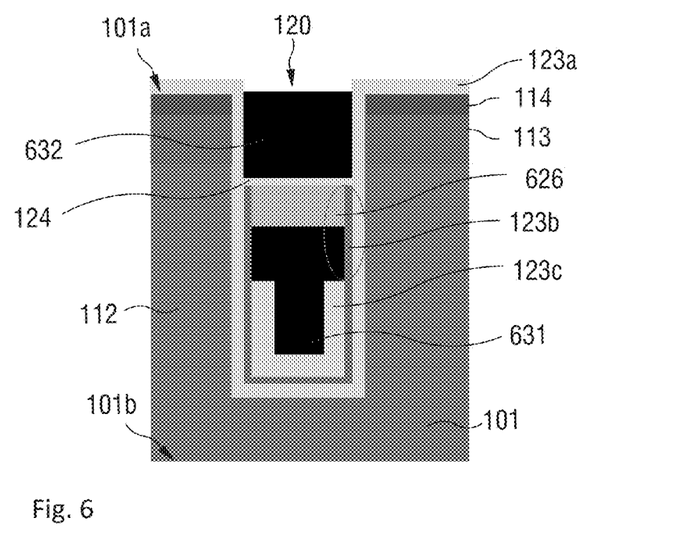
FIG. 6 illustrates, in a cross-sectional view of a semiconductor substrate, further processes according to an embodiment.

FIG. 6 shows further embodiments according to the present disclosure. While the lower conductive structures 131, 331, 431 can have a shape that is substantially defined by the third insulating layer 123c, i.e. have substantially straight sidewalls, a lower conductive structure 631 can be formed such that sidewalls thereof can be in contact the third insulating layer 123c and the second insulating layer 123b. When practicing embodiments, a stepped field electrode can be formed that is separated from the gate electrode.

For forming the lower conductive structure 631, the first conductive material can be deposited in the at least one trench 120 and/or in the first side 101a of the substrate 101. Thereafter, excessive first conductive material can be removed from the first side 101a of the substrate, e.g. by a chemical-mechanical planarization (CMP) process, and the at least one trench 120, e.g. by etching. Further, the third insulation layer 123c can be removed in the upper portion of the at least one trench 120 and partially in the lower portion of the at least one trench 120 so that an upper end of the third insulation layer 123c is recessed relative to an upper end of the second insulation layer 123b. Furthermore, the lower conductive structure 631 can be formed in the lower portion of the at least one trench 120 such that the lower conductive structure 631 extends from below of the upper end of the third insulation layer 123c to above of the upper end of the third insulation layer 123c.

Specifically, the lower conductive structure 631 can be in contact with the second insulation layer 123b above the upper end of the third insulation layer 123c. Thereby, stepped portion of lower conductive structure 631 can be formed. Further, an insulting plug 626 can be formed in the at least one trench 120, specifically on the lower conductive structure 631. The insulation plug 626 can be formed such that a lower end of the insulating plug 126 in contact with an upper end of the lower conductive structure 631. Specifically, the insulation plug 626 can be formed such that a whole surface of the lower end of the insulating plug 126 in contact with a whole surface of the upper end of the lower conductive structure 631. Besides this configuration of the lower conductive structure 631 and the insulation plug 626, the insulation plug 626 can be formed by the same or similar processes and materials described for the insulation plug 126 and/or the insulation plug 426.

Thereafter, some or all processes described with reference to FIGS. 2E and 2F or additional processes not described with reference to FIGS. 2E to 2F can be performed and/or some or all processes described with reference to FIG. 3D or additional processes not described with reference to FIG. 3D can be performed. Alternatively or in addition, some or all processes described with reference to FIGS. 4A to 4E or additional processes not described with reference to FIGS. 4A to 4E can be performed before forming the lower conductive structure 631. When the lower conductive structure 631 is formed as describes with reference to FIG. 4E, the additional processes described with reference to FIG. 4F can be performed, too.

According to some embodiments, a source metallization can be formed. Regions of the body region 113 can be exposed and/or partially etched to perform a body contact implantation can to increase the p-type dopants in a contact area for the source metallization to be formed. For instance, $BF_2$ at 15 keV can be used to implant p-type dopants to a concentration of 1E $15/cm^2$. Thereafter, an annealing process can be performed, e.g. at 975° C. for 30 s. When practicing embodiments, a contact resistance between the doping region and the source metallization can be formed.

For forming the source metallization, TiTiN (titanium-titanium nitride) can be sputtered. A TiSi (titanium silicide) layer can be formed under the TiTiN-layer. A W-layer (tungsten layer) can be formed on the TiN-layer. For instance, the W-layer can be formed to have a thickness of equal to or more than 400 nm and/or equal to or less than 600 nm, typically equal to about 500 nm. Thereafter, the W-layer can patterned by lithographic methods and/or the W-layer and the TiTiN-layer can be plasma etched. After pattering, the source metallization can be completed. Specifically, the source metallization can contact the lower conductive structures 131, 331, 431, 631 and the doping region 114a. According to embodiments, an electrical connection between the body region 113 and/or the source region 114 and at least some of the lower conductive structures 131, 331, 431, 631 in the at least one trench 120 can be formed. When practicing embodiments, the lower conductive structures can form respective field electrodes that facilitate depletion of the drift region, specifically in a blocking mode of the power device.

Further, a gate metallization can be formed for providing an electrically connection to and/or between the upper conductive structures 132, 332, 532 in the at least one trench 120. Specifically, the gate metallization can be formed beside or under the source metallization having an insulating layer disposed in-between and/or openings can be formed in the source metallization to at least partially expose the upper conductive structures 132, 332, 532.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
   a semiconductor substrate having a first side;
   a trench formed in the semiconductor substrate, the trench having a bottom and a sidewall extending from the bottom to the first side of the semiconductor substrate;
   an insulation structure comprising:
      at least a first insulation layer covering the bottom of the trench and extending from the bottom of the trench along the sidewall of the trench to the first side of the semiconductor substrate; and
      a second insulation layer on the first insulation layer and extending along the first insulation layer to an upper end of the second insulation layer being recessed relative to the first side of the semiconductor substrate,
      wherein the first insulation layer and the second insulation layer are comprised of different materials, and
      wherein the upper end of the second insulation layer defines an upper end of a lower portion of the trench;
   a lower conductive structure in the lower portion of the trench, wherein each of the first and the second insulation layers is arranged between the lower conductive structure and the semiconductor substrate; and an upper conductive structure in an upper portion of the trench above the lower portion, wherein the first insulation layer is arranged between the upper conductive structure and the semiconductor substrate.

2. The power semiconductor device of claim 1, wherein the upper conductive structure has a lateral width which is larger than a lateral width of the lower conductive structure.

3. The power semiconductor device of claim 1, wherein the insulation structure further comprises a third insulation layer on the second insulation layer and extending along the second insulation layer to an upper end of the third insulation layer, wherein the third insulation layer comprises a material different than the material of the second insulation layer, wherein each of the first, second and third insulation layers is arranged between the lower conductive structure and the semiconductor substrate.

4. The power semiconductor device of claim 3, wherein the upper end of the third insulation layer is recessed relative to the upper end of the second insulation layer.

5. The power semiconductor device of claim 3, further comprising:

an insulation plug arranged between the lower conductive structure and the upper conductive structure, wherein the insulation plug electrically insulates the lower conductive structure from the upper conductive structure.

6. The power semiconductor device of claim 3, wherein the lower conductive structure and the upper conductive structure are connected and form a common conductive structure.

7. The power semiconductor device of claim 3, wherein the lower conductive structure is in contact with the second insulation layer above the upper end of the third insulation layer.

8. The power semiconductor device of claim 1, wherein:
the upper conductive structure forms a gate electrode;
the lower conductive structure forms a field electrode; and
wherein the semiconductor substrate further comprises:
a drift region;
a source region; and
a body region between the drift region and the source region.

9. The power semiconductor device of claim 1, wherein the insulation structure defines and bounds a space within the trench, wherein the lower portion of the space of the trench is filled at least partially with a first conductive material to form the lower conductive structure in the lower portion of the trench, and wherein the upper portion of the space of the trench is filled at least partially with a second conductive material to form the upper conductive structure in the upper portion of the trench.

10. The power semiconductor device of claim 9, wherein one of:

the first conductive material and the second conductive material are the same conductive material;

the first conductive material and the second conductive material comprise a metal, a metal alloy, a metal silicide, doped polysilicon, or a combination thereof;

the first conductive material and the second conductive material are of different conductive materials;

the first conductive material comprises a metal, a metal alloy, a metal silicides, or a combination thereof, and the second conductive material comprises doped polysilicon; and the first conductive material comprises doped polysilicon, and the second conductive material comprises a metal, a metal alloy, a metal silicide, or combination thereof.

11. The power semiconductor device of claim 9, wherein the first conductive material and the second conductive material comprise a metal, a metal alloy, a metal silicide, doped polysilicon, or a combination thereof, wherein the first conductive material and the second conductive material are of different conductive materials.

12. The power semiconductor device of claim 1, wherein the lower conductive structure and the upper conductive structure form a common conductive structure extending from the lower portion to the upper portion of the trench, wherein the common conductive structure comprises a step at a transition between the lower portion and the upper portion of the trench.

13. The power semiconductor device of claim 1, wherein the second insulation layer comprises an oxygen-resistant material that is impervious to oxygen diffusion.

14. The power semiconductor device of claim 1, wherein the second insulation layer is a silicon nitride layer.

15. The power semiconductor device of claim 1, wherein the trench has an aspect ratio of depth to smallest lateral extension of at least 2:1.

16. The power semiconductor device of claim 1, further comprising:

a doping region in the semiconductor substrate; and
an electrical connection between the doping region and the lower conductive structure in the trench.

* * * * *

UNITED STATES PATENT AND TRADEMARK OFFICE
CERTIFICATE OF CORRECTION

PATENT NO. : 9,812,535 B1  
APPLICATION NO. : 15/363740  
DATED : November 7, 2017  
INVENTOR(S) : R. Haase et al.

Page 1 of 1

It is certified that error appears in the above-identified patent and that said Letters Patent is hereby corrected as shown below:

Column 16, Line 15 (Claim 10, Line 11), please change "silicides," to -- silicide, --.

Signed and Sealed this  
Nineteenth Day of June, 2018

Andrei Iancu  
*Director of the United States Patent and Trademark Office*